United States Patent
Parsons et al.

(10) Patent No.: US 6,319,757 B1
(45) Date of Patent: Nov. 20, 2001

(54) ADHESION AND/OR ENCAPSULATION OF SILICON CARBIDE-BASED SEMICONDUCTOR DEVICES ON CERAMIC SUBSTRATES

(75) Inventors: James D. Parsons; B. Leo Kwak, both of Beaverton, OR (US)

(73) Assignee: Caldus Semiconductor, Inc., Keizer, OR (US)

( * ) Notice: Subject to any disclaimer, the term of this patent is extended or adjusted under 35 U.S.C. 154(b) by 0 days.

(21) Appl. No.: 09/351,106

(22) Filed: Jul. 6, 1999

(Under 37 CFR 1.47)

Related U.S. Application Data (60) Provisional application No. 60/092,039, filed on Jul. 8, 1998.

(51) Int. Cl.[7] .......................... H01L 21/44; H01L 21/48; H01L 21/50

(52) U.S. Cl. .................. 438/127; 438/106; 438/126; 438/455; 438/602; 438/686; 438/931; 427/255.29

(58) Field of Search .................... 438/106, 125, 438/126, 127, 455, 931, 285, 483, 590, 602, 686; 427/255.29

(56) References Cited

U.S. PATENT DOCUMENTS

| | | | |
|---|---|---|---|
| 4,581,279 | * | 4/1986 | Sugishita et al. ...................... 428/209 |
| 4,651,192 | * | 3/1987 | Matsushita et al. ................... 357/74 |
| 4,775,596 | * | 10/1988 | Holleran et al. ...................... 428/432 |
| 4,810,532 | * | 3/1989 | Lavendel et al. ................ 427/255.29 |
| 5,349,207 | * | 9/1994 | Malhi .................................... 257/76 |
| 5,877,516 | * | 3/1999 | Mermagen et al. ................... 257/76 |

OTHER PUBLICATIONS

Savrun, E. and Toy, C., "An Aluminum Nitride Package for 600° C and Beyond," Proc. IEEE, 1998, 0–7803–4540–1/98, pp. 265–268.

Wong, C. P., "Recent advances in hermetic equivalent flip–chip hybrid IC packaging of microelectronics," Materials Chemistry and Physics 42, 1995, pp. 25–30.

Tudanca, M., Luna, R.G., Fraile, A., Triana, J., Gonzalez, J.M., Vincueria, I. and Dominguez, C., "A Low–Cost Manufacturing Process for High–Density Hybrid Components, Based on Multilayer Polyimide/Ceramic Structures," Proceedings of 42nd Electronic Components and Technology Conference, San Diego, CA, 1992, pp. 120–128.

Tong, Q.Y.; Gosele, U.; Yuan, C.; Steckl, A. J. and Reiche, M., "Silicon Carbide Wafer Bonding," J. Electrochem. Soc. 142, No. 1, Jan. 1995, pp. 232–236.

Bhattacharya, P. K., Bonding of SiC slabs for electro–mechanical heat–sinks in advanced packaging applications, Int. J. Electronics vol. 73, No. 1, pp. 71–82, 1992.

(List continued on next page.)

*Primary Examiner*—Matthew Smith
*Assistant Examiner*—Craig P. Lytle
(74) *Attorney, Agent, or Firm*—Marger Johnson & McCollom, P.C.

(57) ABSTRACT

A SiC die with Os and/or W/WC/TiC contacts and metal conductors is encapsulated either alone or on a ceramic substrate using a borosilicate (BSG) glass that is formed at a temperature well below upper device operating temperature limits but serves as a stable protective layer above the operating temperature (over 1000° C., preferably >1200° C.). The glass is preferably 30–50% $B_2O_3$/70–50% $SiO_2$, formed by reacting a mixed powder, slurry or paste of the components at 460°–1000° C. preferably about 700° C. The die can be mounted on the ceramic substrate using the BSG as an adhesive. Metal conductors on the ceramic substrate are also protected by the BSG. The preferred ceramic substrate is AlN but SiC/AlN or $Al_2 O_3$ can be used.

37 Claims, 1 Drawing Sheet

OTHER PUBLICATIONS

Kamijoh, T.; Takano, H. and Sakuta, M., Heat treatment of semi–insulating InP:FE with phosphosilicate glass encapsulation, Jour. Appl. Phys., vol. 55, 1984, pp. 3756–3759.

Wong, C.P. and McBride, R., "Robust Titanate–Modified Encapsulants for High Voltage Potting Application of Multichip Module/Hybrid IC," IEEE Transactions on Components, Hybrids and Manufacturing Technology vol. 16, No. 8, Dec. 1993, pp. 868–875.

Hunadi, R. and Bilow, N., "Low Expansion Blob Top Encapsulants—A New Generation of Materials for Chip–on–Board and Hybrid Packaging," Proceedings of International SAMPE Symposium and Exhibition: 1st International SAMPE Electronic Conference–Electronic Materials and Processes, Santa Clara, CA, Jun. 23–25, 1987, pp. 397.

* cited by examiner

ADHESION AND/OR ENCAPSULATION OF SILICON CARBIDE-BASED SEMICONDUCTOR DEVICES ON CERAMIC SUBSTRATES

RELATED APPLICATION DATA

This application claims priority from U.S. Provisional Application Ser. No. 60/092,039, filed Jul. 8, 1998, for ADHESION AND/OR ENCAPSULATION OF SILICON CARBIDE-BASED SEMICONDUCTOR DEVICES ON CERAMIC SUBSTRATES.

BACKGROUND OF THE INVENTION

This invention relates generally to the adhesion and/or encapsulation of semiconductor devices or circuits on ceramic substrates, and more particularly to the adhesion and/or encapsulation of silicon carbide semiconductors with metal or alloy contacts and conductors, and metal circuits on AlN substrates.

SiC-based semiconductor devices possess tremendous advantages for high temperature and high power solid state electronics. In addition, these devices offer potential advantages for high frequency and logic circuit applications: e.g., power conversion (mixer diodes, MESFETs), and single chip computers (n-MOS, CMOS, bipolar transistors). Non-volatile random access memory SiC CCDs can hold charge for more than a thousand years thus, for example, making hard disks a thing of the past.

The potential maximum average power, maximum operating temperature, thermal stability, and the reliability of SiC electronics, for example, far exceeds Si or GaAs based electronics. The degree to which these advantages of SiC can be utilized, however, is presently constrained by the thermal stability and electrical properties of the metal/SiC junctions. The primary reasons for this are: (1) the power density of SiC devices is limited by the thermal stability of the ohmic contact junctions, and (2) substantial cooling is required to insure the stability of electrical contact junctions.

For a long time, researchers have been striving without success to develop electrical contacts to silicon carbide to overcome the aforementioned constraints. Until these constraints are removed, SiC devices/circuits offer only marginal, if any, advantages over Si and GaAs. Utilization of the full performance potential of SiC itself (for all devices), requires four types of performance-limiting electrical contacts: (1) ohmic to p-type SiC, (2) ohmic to n-type SiC, (3) rectifying to p-type SiC, and (4) rectifying to n-type SiC.

The value of SiC electronics lies in its potential to extend the capabilities of solid state electronics beyond what is possible with Si or GaAs. Thus, suitable electrical contact characteristics obtained in the laboratory—under low stress conditions—must not drift or degrade, due to changes at the metal/SiC junctions, under actual device operating conditions. This requires two additional attributes of metal/SiC electrical contacts. First, the contact metal must form a junction with SiC that is chemically stable to ~1000° C. (joule heating at high forward current densities in power SiC devices could easily cause metal/SiC junctions to reach such temperatures) or more. Second, the contact metal (or metallization structure) must act as a diffusion barrier to circuit and bonding metals (electrode metals) at the same temperatures. Metal/SiC electrical contacts demonstrated previously do not come close to meeting all these stability requirements.

Commonly-assigned U.S. Ser. No. 08/612,216 filed Mar. 7, 1996 (counterpart PCT application PCT/US97/03497, filed Mar. 4, 1997), which is incorporated herein by reference, however, discloses contacts of all four types which have the requisite attributes. What is needed now is a suitable way to package SiC devices with Os and TiC/WC/W contacts and compatible conductive wires or lines on a suitable substrate, so as to be protected mechanically and chemically over a wide range of conditions. The current state of the art fails to meet this need.

Applicant has learned that a TiC contact on _SiC does not, by itself, form a diffusion barrier to circuit or bonding metals. Appropriate circuit/bonding metals such as W, Pt, Au and Pd, form intermetallics with TiC. These solid state reactions change the composition of the electrical contact junction, thus degrading it.

In a recent study, Tong et. al. (Ref. 1) examined the feasibility of fabricating large area SiC substrates from CVD-grown SiC layers on Si(100) substrates via pressure bonding between two thermal oxide layers. The process of Tong et al is as follows: (1) chemical vapor deposition of SiC layer on Si(100), (2) thermal oxidation to form a thin layer of SiO2 on SiC layer, (3) fabrication of a separate Si wafer with thicker thermal oxide layer, (4) surface treatments to enhance the subsequent pressure bonding, (5) pressure induced bonding between two thermal oxide layers, (6) high temperature annealing to improve bonding characteristics by densification, (7) lapping (polishing) to remove the oxide layer from the wafer initially with SiC layer, and finally, (8) chemical etching of exposed Si wafer down to SiC layer.

In addition to the complexity of the process of Tong, et al, the bonding between two thermal oxides is undoubtedly hampered by surface roughness, trapped bubbles, outgassing from the thermal oxides, and a thermal expansion coefficient mismatch among Si, SiO2, and SiC (about 20%). Such problems become markedly more detrimental when the operating conditions become harsher. Moreover, Si itself is not suitable for the high temperature (over 250° C. and as high as 115° C.). Harsh environment applications of SiC electronic devices, because of the thermal expansion mismatch, lower thermal conductivity, and lower melting temperature (1412° C.) of Si, will render the device structurally unstable.

In another bonding study (see Ref. 2), several systems-metals (Al, Ni, Ti, and W), polycrystalline silicon, phosphosilicate glass, and SiO2 have been employed to bond polycrystalline SiC slabs together. However, high temperature annealing (1150° C.) under some controlled ambient conditions (e.g. steam with 2% HCl) was required to achieve effective bonding. This anneal temperature is too high in that it exceeds the stability window of conventional Si devices. Problems associated with the surface roughness of the slabs (as in Ref. 3) arise as well. The bonding process using metallic layers at high temperatures can also lead to silicide formation. This is not suitable for SiC devices because, in the anticipated operating ranges (temperature and environment), the metal layer could become unstable and/or the metal layer will be consumed by the very bonding reaction with SiC which will change the characteristics of the SiC device.

In fact, this instability of a metal layer in contact with SiC at high temperatures has been an obstacle to the development of SiC devices that can fully exploit the advantageous properties of SiC for high temperature electronics. Similarly, the reaction bonding with the phosphosilicate glass poses the potential problem of phosphorous incorporation into SiC, which can change the electrical properties of the device. Thus, a need remains for a suitable SiC-to-substrate adhesion system.

The prior art also has not developed a material and/or process which forms a stable, insulating, and adherent high-temperature (T>1000° C.) encapsulation layer on SiC devices and their related components (metallization on SiC die and AlN package substrate, connecting wires, and die insulating material).

For low-temperature electronic devices, the encapsulation layer is readily formed using many different materials and processes. In the 1970's a ceramic system, known as "CER-ATAB" packaging, was used. (Ref. 4) In more recent years, the encapsulation materials have been silicone with ceramic fillers (Ref. 5), epoxy resins (Ref. 6) and plastics (Ref. 7). A more exotic approach to encapsulation consists of alternating layers of polyamide and ceramic. (Ref. 8) Organic encapsulation materials do not function at high temperatures. The high temperature ceramic materials suffer from high porosity and brittleness problems even if the material itself satisfies the requirement for electrical insulation and high temperature stability.

A recent patent discusses a fabrication process for a ceramic material which consists of zirconia or hafnia powder suspended (encapsulated) in crystalline cordierite (mixture of MgO, CaO and Y2O3) glass-ceramic materials. (Ref. 9) Although this patent states that it is suitable in packaging LSI circuits, the process as described, is not in fact, suitable for encapsulating integrated circuits because the fabrication temperature is too high (840° C.<T<950° C.) for completed Si devices and circuits to withstand. The use must be for fabricating ceramic substrates (on which encapsulated chips are mounted) because the zirconia and/or hafnia would strengthen the cordierite. In another application, phosphosilicate glass was used to encapsulate InP:Fe. (Ref. 10) The phosphorous in this latter process was found to migrate from the encapsulation layer into InP:Fe.

For packaging SiC, the same problem would exist and would change the electrical properties of the devices. A suitable encapsulation material and/or process for the anticipated operating ranges of SiC devices does not exist. Such a need never existed before the advent of "stable" high temperature SiC electronic devices. Now such a need exists, and no prior encapsulation material and method is known to be suitable.

REFERENCES

1. Q. Y. Tong, U. Gosele, C. Yuan, A. J. Steckl, and M Reiche, J. Electrochem. Soc. 142, 232 (1995).
2. P. K. Bhattacharya, Int. J. Electronics 73, 71 (1992).
3. T. Kamijoh, H. Takano and M. Sakuta, Jour. Appl. Phys., Vol. 55, (1984) 3756–3759.
4. J. Jablonski and W. Bielawski, Electronicka, No. 5, 221 (1972).
5. C. P. Wong and R. McBride, IEEE Transactions on Components, Hybrids and Manufacturing Technology 16 (8), 868 (1992).
6. R. Hunadi and N. Bilow, Proceedings of International SAMPE Symposium and Exhibition: 1st International SAMPE Electronic Conference-Electronic Materials and Processes (Santa Clara, Calif., 1987) pg. 397.
7. C. P. Wong, Materials Chemistry and Physics 42, 25 (1995); J. A. Emerson, Proceedings of InterSociety Conference on Thermal Phenomena in the Fabrication and Operation of Electronic Components (Los Angeles, Calif. 1988) pg. 190.
8. M. Tudanca, R. G. Luna, A. Fraile, J. Triana, J. M. Gonzalez, I. Vincueria, and C. Dominguez, Proceedings of 42nd electronic Components and Technology Conference, 120 (San Diego, Calif., 1992) pg. 120.
9. R. W. Adams Jr., D. R. Clark, L. L. Rapp, and B. Schwartz, Ausz. Eur. Patentanmeld. I 4(5) 426 (1988).
10. T. Kamijoh, H. Takano, and M. Sukuta, J. Appl. Phys. 55(10) 3756(1984).

SUMMARY OF THE INVENTION

One object of the invention is to provide a suitable adhesion material and method for adhering an SiC chip to a ceramic package substrate for high temperature operation.

Another object is to provide an encapsulation material and method suitable for packaging SiC chips and associated contacts and conductors either alone or with circuitry on a ceramic substrate for stable high temperature operation.

The process and system of the present invention, overcomes the problems associated with the prior art devices as previously described herein by providing a semiconductor device having at least one silicon carbide-containing layer which can be deployed in extreme thermal environments, while at the same time maintaining stable I/O electrical contact with the device. Without this technology, lateral SiC devices (which require back-side electrical isolation) cannot be deployed in environments of high temperature, or rapid temperature changes.

This can be accomplished by providing a means of deploying SiC devices and circuits and thin film thermocouples and transducers in harsh thermo-chemical environments. More specifically, a stable, electrically insulating hermetic seal can be formed over the SiC-containing layer with electronic devices and related components (metallizations, wires, etc. on the SiC-containing layer and on any underlying substrate). Therefore, this invention satisfies a long standing need for a non-conductive encapsulant that protects circuit components built on or around SiC-based thin film sensors and circuits. It constitutes a high temperature, non-corrosive environment encapsulant for circuitry based on and around the SiC-containing layer.

The thermal and mechanical stability of the resulting hybrid structure does not limit the thermo-chemical or mechanical stresses to which devices including the SiC-containing layer can be subjected.

Furthermore, it is an object of this invention to provide a means of deploying SiC devices in harsh environments, by formation of a stable, insulating bond between SiC electronic devices and underlying ceramic substrates, such as AlN. The substrate is preferably polycrystalline AlN but can be monocrystalline AlN, or a layer of AlN deposited on a SiC substrate.

This encapsulation method can also be used to package devices and circuits on aluminum oxide substrates ($Al_2O_3$). For example, platinum resistive thin film devices on aluminum oxide can be encapsulated using the same composition and process. The need for such adhesives and processes arises from the packaging requirements for various SiC devices under development worldwide, as the performance potential of the SiC devices is expected to extend the operating windows in temperature (caused by external temperature as well as by high-current-induced heating) and chemical environments.

The subject invention includes a method for the protective encapsulation of a SiC-containing substrate and/or the adhesion of a SiC-containing substrate and an underlying ceramic package substrate. This method comprises encapsulating a SiC-containing semiconductor substrate having a first and second major surface. It also can comprise encapsulating the SiC substrate on an underlying insulative package substrate (preferably polycrystalline AlN but suitably monocrystalline AlN or a layer of AlN or SiC ceramic or other compatible bulk substrate materials), having a first and second major surface. At least one of the first and second major surface of the SiC-containing semiconductor substrate can be coated with a stable encapsulating layer which protects said semiconductor device from mechanical degradation and from thermal degradation at temperatures above at least about 1000° C., preferably at temperatures above at least about 1200° C. Furthermore, at least one of the first and second major surface of said SiC-containing semiconductor substrate can be bonded with a bonding material to at least one of the first and second major surface of said underlying package substrate. This bonding material is preferably and advantageously the same material as the encapsulating material. The bonded SiC-containing substrate-underlying ceramic substrate assembly or structure can be formed at temperatures of about 700° C., but, once formed, is stable to the above described temperatures, i.e., at temperatures above at least about 1000° C., preferably up to temperatures above 1200° C.

The stable encapsulating layer is preferably formed by rapidly vamping the temperature of the assembly up to about 700° C. Any metallic circuitry located on the silicon carbide-containing layer or the ceramic substrate is protected against the effects of substantial oxidization/reduction thereof by formation of the stable encapsulating layer. Also, the SiC device bonded to the AlN substrate will be protected against the effects of thermal shock temperature changes from ambient down to −200° C., and up to at least about 1100° C. by the stable encapsulating layer. Preferably, the coefficient of thermal expansion of the stable encapsulating layer is near the coefficient of thermal expansion of the carbide-containing semiconductor substrate. The carbide-containing semiconductor substrate preferably comprises contacts of WC and TiC, and/or Os, with conductors formed of any one of W, Au, Pd, Pt/Au.

The stable encapsulating layer is a form of glass which will protect the surfaces and structures of the carbide-containing semiconductor substrate from mechanical degradation and from thermal degradation at temperatures to a range of at least about 1000° C., and preferably about 1200 to 1250° C. Preferably, the glass employed in this invention is a borosilicate glass ("BSG"), and more preferably, the composition of the BSG comprises 30 to 50% by weight % of $B_2O_3$ and 70 to 50% by weight of $SiO_2$. In any case, the stable encapsulating layer will in general protect metal contacts and circuits on any one of a silicon carbide, and oxide and nitride insulators, as well as metal circuitry on the ceramic substrate.

In the preferred form of the invention, the stable encapsulating layer is formed by applying an unreacted powdery material to one of the first and second major surface of the silicon carbide-containing semiconductor substrate, and heating the unreacted powdery material to a temperature at which it will form the stable encapsulating layer. Moreover, the stable encapsulating layer can be formed at a temperature of less than about 700° C., but once reacted is stable through the operating range of the SiC device, including temperatures substantially exceeding the formation temperature. The preferred powdery materials are a mixture of precursors for borosilicate glass, preferably B2O3 powder and SiO2 powder, 325 mesh size. The powder mixture can be applied dry or in a water dispersion or paste (with a brief pre-heat to drive off the liquid).

It is also a desirable feature of the stable encapsulating layer that, when the bond is formed, the encapsulating material be non-invasive with respective to the carbide-containing semiconductor substrate. Desirably, the stable encapsulating layer is preferably formed at a temperature of less than 1000° C., and retains high viscosity to at least about 1200° C., and is immune to thermal shock to at least about 1100° C., and is electrically insulating. The BSG encapsulant meets this constraint.

In the preferred form of the present invention, the SiC-containing semiconductor substrate is an SiC die and the underlying substrate is polycrystalline AlN. The expansion coefficients of AlN and SiC components are nearly identical in this SiC/AlN structure, and that of the BSG encapsulant is close enough to both SiC and AlN so as to avoid separation or cracking over a wide temperature range.

A method is also provided for the adhesion of a SiC-containing substrate to an underlying ceramic substrate, preferably AlN. The bonding or adhesive material generally comprises a similar composition to the stable encapsulating material discussed above, i.e., preferably a borosilicate glass, and more preferably a glass comprising 30 to 50 weight % of $B_2O_3$ and 70 to 50 weight % of $SiO_2$. The bonding material is preferably formed, as described above, by applying an unreacted powdery material, preferably in paste form, to one of the first and second major surface of said ceramic substrate, placing that surface against one of the surfaces of the SiC die, and heating the unreacted powdery material to at least its bonding temperature, a preferred temperature of about 700° C. within a range of 460° C. to 1000° C.

The foregoing and other objects, features and advantages of the invention will become more readily apparent from the following detailed description of a preferred embodiment of the invention which proceeds with reference to the accompanying drawings.

DETAILED DESCRIPTION OF A PREFERRED EMBODIMENT

The need for thermally stable ohmic and rectifying electrical contacts to n-type and p-type SiC and its solution described in commonly-assigned to pending U.S. patent application Ser. No. 08/612,216 filed Mar. 7, 1996 (counterpart PCT application PCT/US97/03497, filed Mar. 4, 1997) incorporated by reference herein. Osmium (Os) contacts exhibit the following properties:

1. Metal/SiC junction stable to over 1000° C.,
2. Protects its junction with SiC from circuit and bonding metal diffusion (forms an electrically transparent diffusion barrier) to >1000° C., and either
3. Forms an ohmic electrical contact to p-type SiC, or
4. Forms a rectifying (Schottky) contact to n-type SiC.

Osmium (Os) forms a rectifying (Schottky) metal junction on n-type SiC semiconductor surfaces, which remains abrupt and firmly attached to at least 1050° C. On P-type SiC, the Os layer forms an ohmic contact with the lowest specific contact resistance of now possible with ohmic contacts to p-type SiC. Stable, low resistance, p-type ohmic contacts are the key to development of all SiC bipolar high temperature power electronics.

Similarly tungsten/tungsten carbide (W/SC) forms an electrically transparent diffusion barrier (ETDB) for TiC electrical contacts to SiC; (both p- type and n-type) where, the ETDB exhibits the following properties:

1. ETDB/TiC junction is stable to over 1000° C.,
2. Protects its junction with TiC from circuit and bonding metal diffusion to over 1000° C.; thereby, also protecting the TiC/SiC junction.

The electrically transparent diffusion barrier (ETDB) shields TiC/SiC junctions from electrode metals to 1150° C., and forms a metallurgical junction with TiC that remains firmly attached and is stable to 1150° C.

These contacts enable fabrication of SiC devices and circuits that will not degrade, or become unstable, under all strain conditions (thermal, electric field, mechanical) for which SiC itself can perform as a semiconductor device. They remove all restrictions imposed by metal contacts on the thermal operating envelope of SiC solid state device technology. In particular, they provide rectifying (Schottky) junctions and ohmic contacts that will withstand sustained exposure to temperature as high as 1150° C., and electron migration effects at high electric fields.

Based on the foregoing developments, a family of high temperature/power semiconductor devices can be produced which satisfy a number of unmet commercial needs. One immediate application is thermal sensors. The SiC devices contacts can be used to make junction or resistive thermistors, that measure temperatures to 1922° F. (>1050° C.), and 2100° F. (1150° C.). This development permits SiC thermistors to compete, for the first time, with thermocouples, oxide resistors and pyrometers in the temperature range of 300° F. to 2100° F. (150° C. to 1150° C.). It also enables the manufacture of hostile environment transducers, operable at temperatures above 460° F. (238° C.).

Other SiC devices that can now be made include Schottky diodes, PN diodes and transistors as either discrete devices or as components of integrated circuits. Importantly, this technology opens up many potential applications in the power conditioning and conversion field, such as power rectifiers for converting AC power to clean DC power. N-SiC Schottky rectifiers could handle powers nearly as high as the best Si PN junction rectifiers, and PN junction SiC rectifiers could replace vacuum tubes. Other types of devices include bipolar transistors, thyristors, MOSFETs, MESFETs, IGBTs, and mixer diodes for use in communications, as well as digital and analog to digital electronics.

All solid state semiconductor devices require one, or more, of the four electrical contacts discussed above. The invention of PCT/US97/03497 makes all four of these electrical contacts possible, and facilitates connection to the devices to metal conductors including tungsten, platinum, palladium, gold, and platinum/gold and palladium/gold, especially tungsten which readily oxidizes at high temperature.

Protective encapsulation and adhesion of a SiC-containing substrate containing such devices, contacts and conductors, and an underlying substrate also containing metal conductors, can be provided employing the method of the present invention. Typically, this method comprises providing a carbide-containing semiconductor substrate having a first and second major surface and an underlying substrate having a first and second major surface. A bonding material is also preferably employed to bond at least one of the first and second major surface of the SiC-containing substrate to at least one of the first and second major surface of the underlying substrate. The bonded SiC-containing substrate-underlying substrate structure is formed without substantial mechanical or thermal degradation. Then, at least one of the first and second major surface of the SiC-containing semiconductor substrate is coated with a stable encapsulating layer which protects the semiconductor device from mechanical degradation and from thermal degradation. Preferably, both the encapsulating and bonding functions are performed using a single encapsulating-bonding material. For example, it has been discovered that a single glass compound, borosilitate glass (BSG), can be employed which provides the dual functionality by serving both as the encapsulating and bonding material.

The adhesive and encapsulation mixture is preferably initially composed of finely ground and mixed powders of the unreacted constituent oxides capable of forming the glass material. It can be applied to the area requiring adhesion of encapsulation as a dry powder, or as a slurry. In slurry form, all vaporizable slurry constituents (e.g. water) should be baked off before performing the forming process. The process is thermally activated by melting the $B_2O_3$ at $T_{\_}=460°$ C. The rate at which the glass forms is dependent on the ratio of $B_2O_3$ to $SiO_2$ in the unreacted mixture, how well the powders are mixed, and the formation temperature employed. Rate is increased by more $B_2O_3$, finer and better mixed powder, and higher temperatures.

The reaction from a powder or slurry to a solid glass is irreversible. Once formed, at temperatures of 460° C. up to 1000° C. (preferably 700° C.) the glass will not revert back to its original powdery or slurry state, nor will it melt even at temperatures well over 1000° C., e.g. 1200° C.

The reacting glass layer typically interacts adhesively with the surfaces it contacts. For instance, the above-described glass material can bond with nitride surfaces in accordance with a parabolic rate limiting reaction. The reaction region thickness is quite thin, and is composed of oxides, and in some instances nitrides. It remains stable and electrically insulating once formed. The encapsulant or adhesion layer can also bond with SiC surfaces by forming an oxide (parabolic rate limited). Bonds can also be formed with SiC through an intermediate Si layer on the SiC surface. This intermediate layer is formed by oxidizing the Si layer and possibly some of the SiC surface, fusing with oxides with which it is in contact, and thereby forming a non-reactive, protective coating over metals and metal carbides.

EXAMPLE 1

Figure 1:
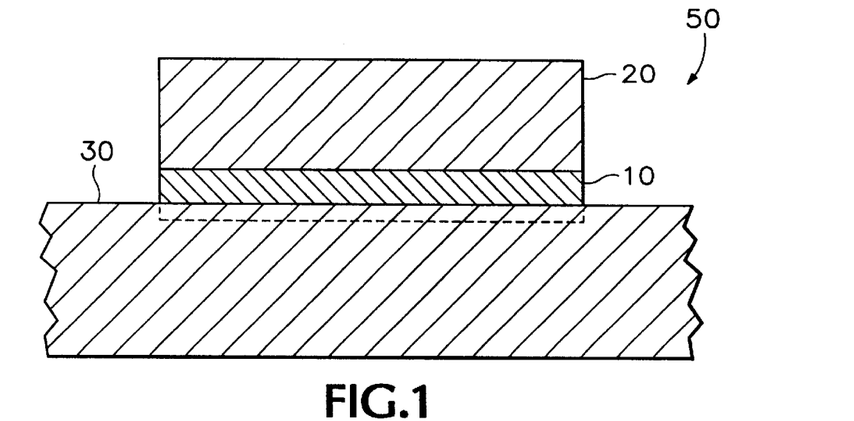
FIG. 1 is a cross-sectional diagram of a semiconductor device having at least one silicon carbide-containing layer bonded to an underlying ceramic substrate made according to the present invention.

As depicted in FIG. 1, a bonding material 10, comprising borosilicate glass (composition=30 to 50 weight % $B_2O_3$+70 to 50 weight % $SiO_2$), was produced and was employed as a high temperature, shock immune adhesive to bond an SiC wafer 20 to AlN die 30. The resulting structure is a SiC semiconductor on ceramic substrate 50.

The bonding material 10 was initially composed of finely ground and mixed powders of: (a) unreacted constituent oxides, or (b) reacted mixture. The adhesive was applied to one of the bonding surfaces (preferably the bottom side of the SiC wafer) as a dry powder, but can also be applied in the form of a slurry. In slurry form, all vaporizable slurry constituents (e.g. water) should be baked off before performing the bonding process.

The surfaces to be bonded (at least one of them coated with the dried adhesive) were placed together, and shift pressure was applied. The process is thermally activated by transferring the assembly from ambient air to an oven preheated to a range of 700° C. to 800° C. This step vamped the temperature of the assembly up quickly (a few seconds at most), from ambient to over 700° C. Reaction can be activated at temperatures as low as 600° C. for unreacted constituent powders, to temperatures above 1000° C. for already reacted powders. Using a fast temperature vamp allows this reaction to be done in ambient air. The BSG reacts and protects metals before they can oxidize. Longer thermal reaction processes can be used if done in an oxygen free atmosphere.

Adhesive-AlN bonding occurs by chemical reaction. The reaction region thickness is quite thin, and is composed of oxides and perhaps nitrides. It remains stable and electrically insulating once formed.

Adhesive-SiC bonding can be accomplished by one of three methods:

1. The adhesive is in contact with SiC surface so that the "bond" is formed by oxidizing the SiC surface.
2. The adhesive is in contact with a thin Si layer on the SiC surface so that the bond is formed by oxidizing the Si layer and possibly some of the SiC surface.
3. The adhesive is in contact with a native grown oxide on the SiC surface so that the bond is formed by fusion between the adhesive and the native SiC oxide.

Figure 2:
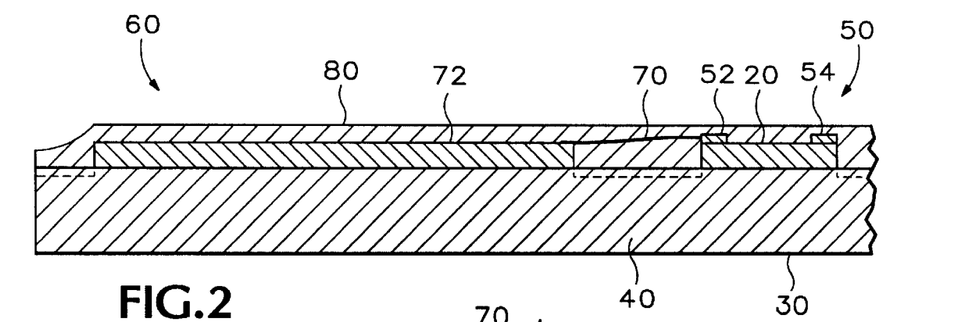
FIG. 2 is a cross-sectional diagram of a ceramic substrate having a silicon carbide-containing layer bonded to it and an encapsulating coating layer coated thereon according to the present invention.

The completed preferred die bond structure 50 is shown in FIG. 1, and in encapsulated form in FIG. 2. Unique features of this structure 50 include that: (a) it responds to mechanical and thermal stress as though it was a single piece, and (b) it is stable up to temperatures of at least about 1100° C.

The structure 50 exhibited a high degree of thermal shock resistance. More specifically, the thermal shock resistance of structure 50 is thought to occur because: (a) the expansion coefficients of AlN die 30 and SiC 20 wafer are nearly identical, (b) the expansion coefficient of the bonding material 10 is not much different from that of the AlN die or SiC wafer, and (c) heat can be introduced into, or extracted from, the bonding material 10 at an extremely rapid rate because of the high thermal conductivities of SiC wafer 20 and AlN die 30.

EXAMPLE 2

The protective attributes of the stable encapsulating layer of this invention were experimentally determined, as follows:

Referring now to FIG. 2, a portion of a tungsten (W) wire 70, which oxidizes easily, was connected to a metal bond pad 52 on an ohmic contact on the SiC chip and to the metal bond pad 72 on the AlN substrate. The assembly 50 as well as the wire 70 and pads 52, 72 were then encapsulated within an encapsulating layer 80, on the AlN die 30, following the temperature vamping procedure described in Example 1. Then the encapsulated assembly was heated to 1200° C. in air for 30 minutes. As a control, a portion of the tungsten wire 70 was not encapsulated by encapsulating layer 80. In general, elemental tungsten forms two types of oxides $WO_2$ (purple) and $WO_3$ (yellow). The result of this experiment was as follows: (1) the exposed portion of the tungsten wire 20 was oxidized and formed a yellow, non-conductive powder ($WO_3$), (2) the encapsulated portion of the tungsten wire 20 remained grayish-silver (elemental, apparently unoxidized W) and its conductivity remained unchanged, no apparent reaction occurred between the tungsten wire 70 and either the encapsulating layer 80 on atmospheric oxygen.

Next, the AlN/encapsulant/SiC structure 60 after formation thereof was inserted into liquid nitrogen, left in the liquid nitrogen for about 10 minutes, and then removed therefrom. No changes were observed in the mechanical properties of the structure 60. Finally, the above AlN/encapsulant/SiC structure 10 was placed in an 850° C. furnace for 30 minutes, the temperature was increased to 1150° C. for 30 minutes, the temperature was lowered to 850° C. for 30 minutes, and then structure 10 was removed from the furnace. No change in the mechanical properties of the structure were observed.

Figure 3:
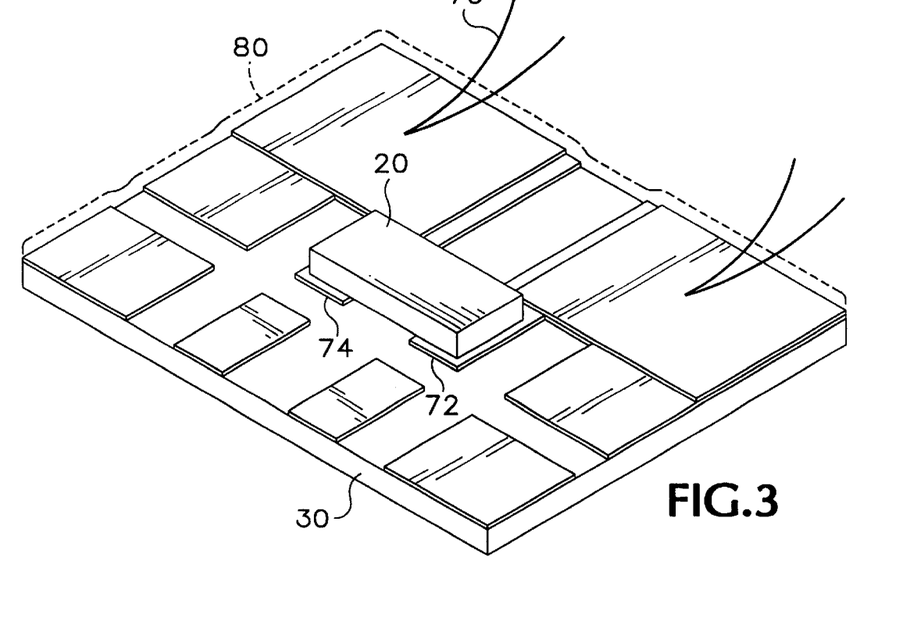
FIG. 3 is a perspective view of a thermally sensitive SiC resistor mounted in a flip chip manner on an AlN die and encapsulated according to the present invention.

FIG. 3 is a perspective view of an assembly similar to that of FIG. 2, showing the SiC die 20 mounted in a "flip chip" configuration, connected directly to bonding pads 72, 74 on the AlN die 30 and covered by BSG encapsulant 80. Thus, the SiC wafer 20 can be adhered to a ceramic substrate such as AlN die 30, using BSG as an adhesive, or using BSG as an encapsulant, or both.

Having described and illustrated the principles of the invention in a preferred embodiment thereof, it should be apparent that the invention can be modified in arrangement and detail without departing from such principles. We claim all modifications and variation coming within the spirit and scope of the following claims.

What is claimed is:

1. A method for the protective encapsulation of a semiconductor device having at least one silicon carbide-containing layer, which comprises the steps of
    (a) providing a silicon carbide-containing semiconductor substrate having a first and second major surface; and
    (b) coating at least one of the first and second major surface of the silicon carbide-containing semiconductor substrate with a stable encapsulating layer which protects the semiconductor device from mechanical degradation and from thermal degradation at a temperature greater than 1000° C.

2. A method according to claim 1, wherein the stable encapsulating layer is formed at a temperature of less than 1000° C.

3. A method according to claim 1, wherein said silicon carbide-containing layer includes metal contacts or circuitry which is protected against the effects of substantial oxidization/reduction thereof by the encapsulation layer.

4. A method according to claim 1, wherein said semiconductor device and said encapsulation layer resists thermal shock in a temperature range of from −200° C. to 1100° C.

5. A method according to claim 1, wherein the stable encapsulating layer is a glass which is formed at a temperature less than 1000° C. and which protect the surfaces and structures of said carbide-containing semiconductor substrate from mechanical degradation and from thermal degradation at temperatures above 1000° C.

6. A method according to claim 5, wherein the glass is a borosilicate glass.

7. A method according to claim 6, wherein the composition of said glass comprises 30 to 50 weight % of $B_2O_3$ and 70 to 50 weight % Of $SiO_2$.

8. A method according to claim 1, wherein the silicon carbide-containing semiconductor substrate comprises contacts formed of WC and TiC.

9. A method according to claim 1, wherein the silicon carbide-containing semiconductor substrate comprises contacts formed of Os.

10. A method according to claim 1, wherein the silicon carbide-containing semiconductor substrate comprises conductors coupled to contacts which are formed of one of W, Pt, Pd, Au, Pt/Au, and Pd/Au.

11. A method according to claim 1, wherein the stable encapsulating layer protects metal contacts and circuits on any one of a silicon carbide, oxide and nitride surface.

12. A method according to claim 1, wherein the stable encapsulating layer is formed by applying an unreacted powdery material to one of the first and second major surface of said silicon carbide-containing semiconductor substrate, and heating the unreacted powdery material to a temperature less than 1000° C. which will form the stable encapsulating layer.

13. A method according to claim 1, wherein the stable encapsulating layer is formed at a temperature of about 700° C. or less.

14. A method according to claim 1, wherein the stable encapsulating layer is bonded to the first and second major surface of the silicon carbide-containing semiconductor substrate.

15. A method according to claim 14, wherein the bond formed between the encapsulating layer and the silicon carbide-containing semiconductor substrate is non-invasive with respective to the silicon carbide-containing semiconductor substrate.

16. A method according to claim 15, wherein the stable encapsulating layer is immune to thermal shock in the temperature range of up to about 1100° C.

17. A method according to claim 15, wherein the encapsulating layer is electrically insulating.

18. A method according to claim 15, wherein the Si carbide-containing semiconductor substrate is bonded to an underlying substrate.

19. A method according to claim 15, wherein the underlying substrate comprises a layer of AlN.

20. A method according to claim 16, wherein the expansion coefficients of AlN and SiC are nearly identical.

21. A method according to claim 15, wherein the underlying substrate comprises a layer of polycrystalline AlN.

22. A method according to claim 15, wherein the underlying substrate comprises a layer of AlN on a SiC substrate.

23. A method for the adhesion of a SiC-containing substrate to an underlying substrate in the formation of a semiconductor device, which comprises the steps of:

(a) providing said SiC-containing substrate having a first and second major surface;
(b) providing said underlying substrate having a first and second major surface; and
(c) bonding with a bonding material one of the first and second major surface of said SiC-containing substrate to one of the first and second major surface of said underlying substrate, said bonded SiC-containing substrate-underlying substrate structure being adhered to the underlying substrate without substantial mechanical or thermal degradation at temperatures up to at least about 1000° C.

24. A method according to claim 23, wherein said SiC-containing substrate is bonded to said underlying substrate at a temperature of greater than 460° C. and less than about 1000° C.

25. A method according to claim 23, wherein said semiconductor device including said SiC-containing substrate bonded to said underlying substrate does not undergo substantial thermal shock in a temperature range of from −200° C. to 1100° C.

26. A method according to claim 23, wherein the bonding material is a glass which will not undergo mechanical degradation and thermal degradation at temperatures above at least about 1000° C.

27. A method according to claim 26, wherein the glass is a borosilicate glass.

28. A method according to claim 24, wherein the composition of said glass comprises 30 to 50 weight % of $B_2O_3$ and 70 to 50 weight % of $SiO_2$.

29. A method according to claim 23, wherein the bonding material forms a stable encapsulating layer which protects metal contacts and circuits on any one of a silicon-carbide, -oxide and -nitride surface.

30. A method according to claim 23, wherein the bonding material is formed by applying an unreacted powdery material to one of the first and second major surface of said silicon carbide-containing semiconductor substrate, and heating the unreacted powdery material to at least its bonding temperature.

31. A method according to claim 23, wherein bonding is effected at a temperature of about 700° C.

32. A method according to claim 23, wherein bonding of the silicon carbide-containing semiconductor substrate to the underlying substrate is non-invasive with respect to the silicon carbide-containing semiconductor substrate.

33. A method according to claim 23, wherein the SiC-containing substrate is SiC and the underlying substrate includes a layer of AlN.

34. A method according to claim 23, wherein the expansion coefficients of AlN and SiC are nearly identical.

35. A method for the protective encapsulation and adhesion of a SiC-containing substrate and an underlying substrate, which comprises the steps of providing a Si carbide-containing semiconductor substrate having a first and second major surface;
providing said underlying substrate having a first and second major surface;
bonding with a bonding material at least one of the first and second major surface of said SiC-containing substrate to at least one of the first and second major surface of said underlying substrate being formed without substantial mechanical or thermal degradation at a temperature of at least 1000° C.; and
coating at least one of the first and second major surface of said Si carbide-containing semiconductor substrate with a stable encapsulating layer which protects said semiconductor device from mechanical degradation and from thermal degradation at temperature of at least 1000° C.

36. A method for the protective encapsulation of a SiC-containing substrate and an underlying substrate, which comprises the steps of (a) providing a Si carbide-containing semiconductor substrate having a first and second major surface;
(b) providing said underlying substrate having a first and second major surface; and
(c) coating at least one of the first and second major surface of said Si carbide-containing semiconductor substrate at a temperature of less than about 700° C. and thereby forming a stable encapsulating layer, said stable encapsulating layer protecting said semiconductor device from mechanical degradation and from thermal degradation at a temperature of at least about 1000° C.

37. A method for adhesion of a SiC-containing substrate and an underlying substrate, which comprises the steps of (a) providing a Si carbide-containing semiconductor substrate having a first and second major surface;

(b) providing said underlying substrate having a first and second major surface; and (c) bonding together with a bonding material at least one of the first and second major surface of said SiC-containing substrate to at least one of the first and second major surface of said underlying substrate, at a temperature of not more than about 700° C., said bonding together of said SiC-containing substrate to said underlying substrate being formed without substantial mechanical or thermal degradation at temperatures up to at least about 1000° C.

* * * * *

UNITED STATES PATENT AND TRADEMARK OFFICE
CERTIFICATE OF CORRECTION

PATENT NO.   : 6,319,757 B1
DATED        : November 20, 2001
INVENTOR(S)  : Parsons et al.

It is certified that error appears in the above-identified patent and that said Letters Patent is hereby corrected as shown below:

<u>Column 12,</u>
Line 7, "Claim 24" should read -- Claim 27 --.
Line 30, "Claim 23" should read -- Claim 33 --.

Signed and Sealed this

Seventeenth Day of February, 2004

JON W. DUDAS
*Acting Director of the United States Patent and Trademark Office*